(12) United States Patent
Arai

(10) Patent No.: US 10,472,461 B2
(45) Date of Patent: Nov. 12, 2019

(54) SEMICONDUCTOR DEVICE AND IMAGE SENSOR MODULE

(71) Applicant: NAMICS CORPORATION, Niigata (JP)

(72) Inventor: Fuminori Arai, Niigata (JP)

(73) Assignee: NAMICS CORPORATION, Niigata (JP)

( * ) Notice: Subject to any disclaimer, the term of this patent is extended or adjusted under 35 U.S.C. 154(b) by 4 days.

(21) Appl. No.: 15/556,964

(22) PCT Filed: Mar. 9, 2016

(86) PCT No.: PCT/JP2016/057353
§ 371 (c)(1),
(2) Date: Sep. 8, 2017

(87) PCT Pub. No.: WO2016/143815
PCT Pub. Date: Sep. 15, 2016

(65) Prior Publication Data
US 2018/0051127 A1 Feb. 22, 2018

(30) Foreign Application Priority Data
Mar. 12, 2015 (JP) ................. 2015-048926

(51) Int. Cl.
C08G 59/66 (2006.01)
C09J 11/06 (2006.01)
(Continued)

(52) U.S. Cl.
CPC ........... C08G 59/66 (2013.01); C08G 59/184 (2013.01); C08G 59/56 (2013.01); C08G 59/621 (2013.01);
(Continued)

(58) Field of Classification Search
CPC ..................................... C08G 59/66
See application file for complete search history.

(56) References Cited

U.S. PATENT DOCUMENTS 5,430,112 A    7/1995  Sakata et al.
2002/0010287 A1  1/2002  Ohashi et al.
(Continued)

FOREIGN PATENT DOCUMENTS

JP       06211969       8/1994
JP    2000080153 A2    3/2000
(Continued)

OTHER PUBLICATIONS

Machine translation of KR 2013137993 by Seo (Year: 2013).*
(Continued)

Primary Examiner — Michael M Dollinger
Assistant Examiner — Christina H. W. Rosebach
(74) Attorney, Agent, or Firm — Rankin, Hill & Clark LLP

(57) ABSTRACT

The present invention is intended to provide a semiconductor device including adherends bonded with a cured product of an adhesive, the semiconductor device being configured such that a decrease in bonding strength after curing in a moisture resistance test is suppressed. In this semiconductor device, at least two adherends 20 and 70, 70 and 60, 70 and 50 made of at least one material selected from the group consisting of engineering plastic, ceramics, and metal are bonded with a cured product 10 of an adhesive containing (A) thermosetting resin, (B) a particular thiol compound, and (C) a latent curing agent.

15 Claims, 1 Drawing Sheet

(51) Int. Cl.

| | | |
|---|---|---|
| *C09J 133/06* | (2006.01) | |
| *C09J 163/00* | (2006.01) | |
| *H01L 27/14* | (2006.01) | |
| *C08G 59/18* | (2006.01) | |
| *C08G 59/56* | (2006.01) | |
| *C08G 59/68* | (2006.01) | |
| *C08K 3/36* | (2006.01) | |
| *C08K 5/00* | (2006.01) | |
| *C08K 5/06* | (2006.01) | |
| *C08G 59/62* | (2006.01) | |
| *G02B 7/02* | (2006.01) | |
| *G02B 7/08* | (2006.01) | |
| *G02B 19/00* | (2006.01) | |
| *H01L 27/146* | (2006.01) | |
| *C08K 5/378* | (2006.01) | |

(52) U.S. Cl.
CPC ............ *C08G 59/686* (2013.01); *C08K 3/36* (2013.01); *C08K 5/005* (2013.01); *C08K 5/06* (2013.01); *C09J 11/06* (2013.01); *C09J 133/06* (2013.01); *C09J 163/00* (2013.01); *G02B 7/021* (2013.01); *G02B 7/08* (2013.01); *G02B 19/0076* (2013.01); *H01L 27/14* (2013.01); *H01L 27/146* (2013.01); *H01L 27/14618* (2013.01); *H01L 27/14625* (2013.01); *C08K 5/378* (2013.01)

(56) References Cited

U.S. PATENT DOCUMENTS

| | | | |
|---|---|---|---|
| 2011/0316108 A1* | 12/2011 | Nihei | ................ H01L 27/14618 |
| | | | 257/435 |
| 2016/0289237 A1* | 10/2016 | Kumano | .............. C07D 487/04 |
| 2017/0073459 A1 | 3/2017 | Iwaya et al. | |

FOREIGN PATENT DOCUMENTS

| | | |
|---|---|---|
| JP | 3367531 B2 | 1/2003 |
| JP | 2015059099 A2 | 3/2015 |
| WO | 2015080241 A1 | 6/2015 |
| WO | 2015141347 A1 | 9/2015 |
| WO | 2016027716 A1 | 2/2016 |

OTHER PUBLICATIONS

"Using heavy copper and extreme copper in pcb design and fabrication for maximum reliability" by Basista. Wayback Machine capture Aug. 13, 2013; available at https:www.epectec.com/articles/heavy-copper-pcb-design.html (Year: 2013).*

"Computer Chips Built for Speed" by Copper Development Association, Inc. Available at https://www.copper.org/publications/newsletters/discover/2004/december/article3.html. (Year: 2004).*

Translation of JP 2007270130 by Dodo et al. (Year: 2007).*

International Search Report dated Apr. 5, 2016 filed in PCT/JP2016/057353.

* cited by examiner

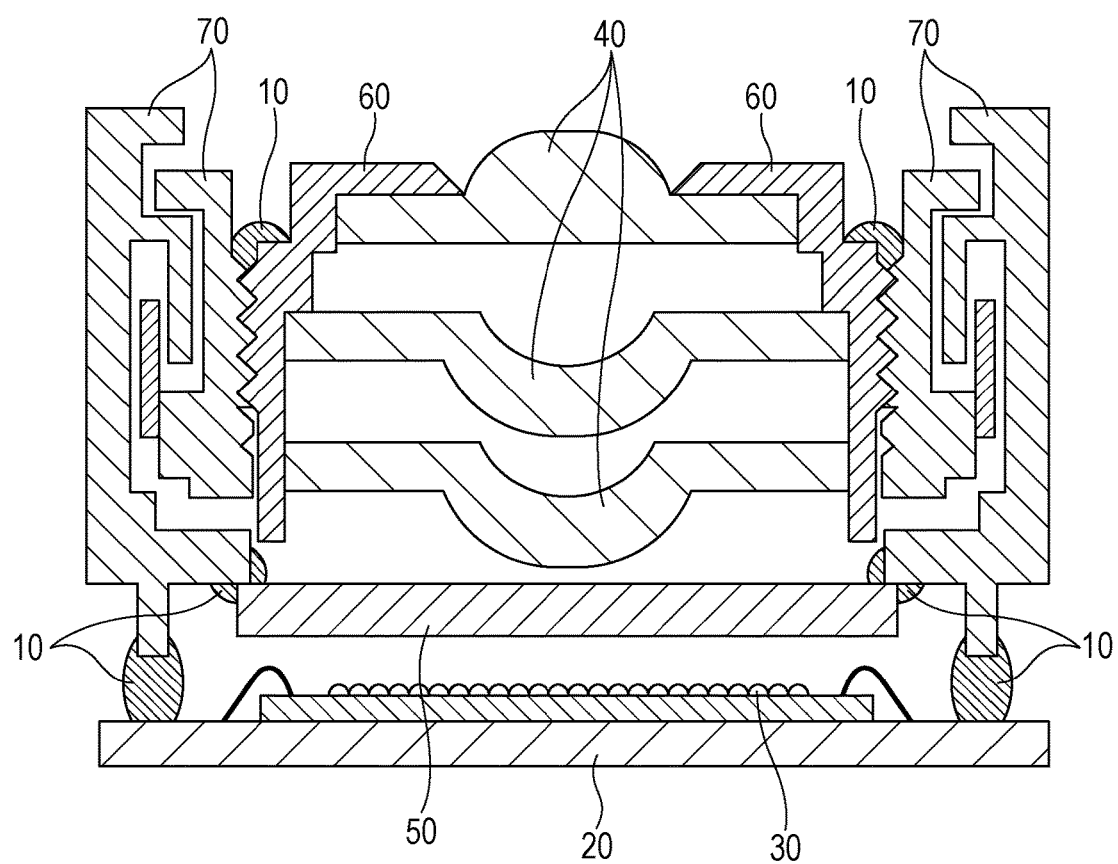

SEMICONDUCTOR DEVICE AND IMAGE SENSOR MODULE

TECHNICAL FIELD

The present invention relates to a semiconductor device and an image sensor module. Specifically, the present invention relates to a semiconductor device including particular adherends bonded with a particular adhesive and to an image sensor module.

BACKGROUND ART

Members of a recent image sensor module have been made of various materials such as glass, metal, and liquid crystal polymer (hereinafter referred to as "LCP"). When these members made of various materials are adherends, an adhesive exhibiting high moisture resistance reliability relating to bonding strength has been demanded regardless of the materials of the adherends. It has been known that an epoxy-resin-thiol-curing-agent-based resin composition is effective for realizing recently-demanded high low-temperature fast curability (e.g., Patent Literature 1). However, there is a problem that a typical thiol-based curing agent (e.g., pentaerythritol tetrakis(3-mercaptopropionate) (Product Name: PEMP) manufactured by SC Organic Chemical Co., Ltd., trimethylolpropane tris(3-mercaptopropionate) (Product Name: TMMP) manufactured by SC Organic Chemical Co., Ltd., and pentaerythritol tetrakis(3-mercaptobutyrate) (Product Name: Karenz MT PE1) manufactured by Showa Denko K. K.) exhibits poor moisture resistance of the resin composition after curing. This might be because any of the typical thiol-based curing agents contains an ester structure in a skeleton.

CITATION LIST

Patent Literature

PATENT LITERATURE 1: Japanese Patent No. 3367531

SUMMARY OF THE INVENTION

Problems to be Solved by the Invention

The present invention has been made in view of the above-described problem. The present invention is intended to provide the following semiconductor device. That is, this semiconductor device includes adherends bonded with a cured product of an adhesive. A decrease in the bonding strength of the adhesive after curing in a moisture resistance test is suppressed.

Solution to the Problems

The inventor(s) of the present invention has conducted intensive studies to solve the above-described problem. The semiconductor device configured such that the bonding strength can be reduced in the moisture resistance test is obtained in such a manner that at least two adherends used as members of the semiconductor device such as an image sensor module and each made of a frequently-used material are bonded with a cured product of an adhesive containing (A) epoxy resin, (B) a particular thiol compound, and (C) a latent curing agent.

The present invention relates to a semiconductor device and an image sensor module for which the above-described problem is solved by the following configuration.

[1] A semiconductor device comprising:
at least two adherends made of at least one material selected from the group consisting of engineering plastic, ceramics, and metal and bonded with a cured product of an adhesive, wherein the adhesive contains:
(A) thermosetting resin,
(B) a thiol compound represented by a general formula (1):

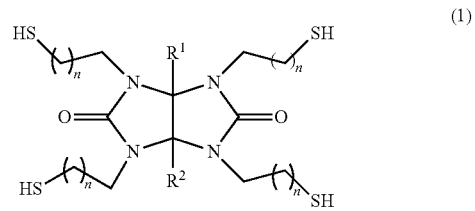

(1)

where R1 and R2 independently denote hydrogen, an alkyl group with a carbon number of 1 to 10, or a phenyl group and n is an integer of 0 to 10, and
(C) a latent curing agent.

[2] The semiconductor device according to the above-described [1], wherein the component (A) is at least one selected from the group consisting of epoxy resin and acrylic resin.

[3] The semiconductor device according to the above-describe [1] or [2], wherein the engineering plastic is super engineering plastic.

[4] The semiconductor device according to any one of the above-described [1] to [3], wherein the engineering plastic is at least one selected from the group consisting of liquid crystal polymer, polycarbonate, polyimide, polyamide, and epoxy resin.

[5] The semiconductor device according to any one of the above-described [1] to [4], wherein an imaging device is on the ceramics.

[6] The semiconductor device according to any one of the above-described [1] to [5], wherein an optical component is on the engineering plastic.

[7] The semiconductor device according to any one of the above-described [1] to [5], wherein an electronic component is on the engineering plastic.

[8] An image sensor module comprising: the semiconductor device according to any one of the above-described [1] to [7].

Effects of the Invention

According to the aspect [1] of the present invention, the highly-reliable semiconductor device using the adhesive for suppressing a decrease in the bonding strength of the adhesive after curing in the moisture resistance test can be provided.

According to the aspect [7] of the present invention, the highly-reliable image sensor module using the adhesive for suppressing a decrease in the bonding strength of the adhesive after curing in the moisture resistance test can be provided.

BRIEF DESCRIPTION OF THE DRAWINGS

FIG. 1 is an example of a sectional view of an image sensor module.

DESCRIPTION OF THE EMBODIMENTS

A semiconductor device of the present invention is configured such that at least two adherends made of at least one material selected from the group consisting of engineering plastic, ceramics, and metal are bonded with a cured product of an adhesive, the adhesive containing
(A) thermosetting resin,
(B) a thiol compound represented by a general formula (1):

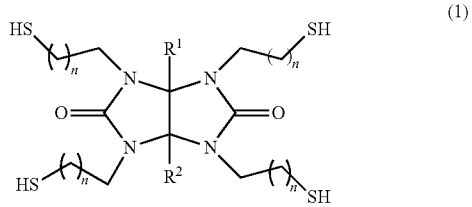

(in the formula, R1 and R2 independently denote hydrogen, an alkyl group with a carbon number of 1 to 10, or a phenyl group and n is an integer of 0 to 10), and (C) a latent curing agent. The semiconductor device described herein indicates general devices which can function by means of semiconductor properties. The semiconductor device includes, for example, an electronic component, a semiconductor circuit, and a module and electronic equipment incorporating these elements.

Each adherend is made of at least one material selected from the group consisting of engineering plastic, ceramics, and metal. The engineering plastic (hereinafter referred to as "EP") described herein indicates material exhibiting a tensile strength of equal to or greater than 49 MPa and a flexural modulus of equal to or greater than 2.5 GPa even after exposure to an environment of 100° C. for 100 hours. Any of thermoplastic EP and thermosetting EP can be used as the EP. The thermoplastic EP includes, for example, polyacetal, polyamide (PA), polycarbonate (PC), modified polyphenylene ether, polybutylene terephthalate, glass fiber (GF) reinforced polyethylene terephthalate, ultra-high-molecular-weight polyethylene, and syndiotactic polystyrene. The thermosetting EP includes, for example, epoxy, glass epoxy (FR-4), phenol, and silicone.

Moreover, the EP is preferably super engineering plastic. The super engineering plastic (hereinafter referred to as "super EP") described herein indicates material exhibiting a tensile strength of equal to or greater than 49 MPa and a flexural modulus of equal to or greater than 2.5 GPa even after exposure to an environment of 150° C. for 100 hours. The super EP includes, for example, acrylate polymer, polysulfone, polyether sulphone, polyphenylene sulfide, polyether ether ketone, polyimide (PI), polyether imide, fluorine resin, and LCP.

Considering thermal resistance, dimension stability, and electric insulation, the EP is preferably one selected from the group consisting of LCP, polycarbonate (PC), polyimide (PI), polyamide (PA), and epoxy resin.

The ceramics include, for example, alumina (Al2O3), aluminum nitride, (AlN), silicon carbide (SiC), boron nitride (BN), silicon nitride (SiN), and glass. Considering thermal conductivity, a coefficient of thermal expansion, and chemical durability, alumina and silicon nitride are preferable.

The metal includes, for example, stainless steel, titanium and alloy thereof, nickel and alloy thereof, copper and alloy thereof, tin and alloy thereof, aluminum and alloy thereof, and solder. Considering chemical stability such as oxidation resistance, stainless steel and nickel and alloy thereof are preferable.

Then, the ceramics is used as a substrate of an image sensor module. In this case, preferably, an imaging device is on the ceramics. Moreover, the engineering plastic is used as a voice coil motor (VCM) of the image sensor module. In this case, preferably, an optical component is on the engineering plastic.

The adhesive according to the semiconductor device of the present invention is extremely suitable for use in the image sensor module. FIG. 1 illustrates an example of a sectional view of the image sensor module. The image sensor module 1 illustrated in FIG. 1 is irradiated with downward light from above. Such light transmits through an optical filter (an infrared (IR) filter) 50 by way of optical lenses 40, and then, reaches an image sensor 30 on a substrate 20. Then, the light is converted into an electric signal by the image sensor 30. In this example, the optical lenses 40 are fixed by a lens barrel 60. The lens barrel 60 fixed to a voice coil motor (VCM) 70 is moved up and down by the VCM 70. In this manner, a focal point on the image sensor 30 is adjusted. The adhesive used for the semiconductor device of the present invention can be used for all of bonding between the substrate 20 and the VCM 70, bonding between the VCM 70 and the lens barrel 60, and bonding between the VCM 70 and the optical filter 50. A material used for the substrate 20 includes, for example, EP such as polyimide, and ceramics such as alumina. A material used for the lens barrel 60 includes, for example, EP such as LCP. A material used for the VCM 70 includes, for example, EP such as LCP. Specifically, the adhesive used for the semiconductor device 1 of the present invention exhibits excellent bonding strength after a moisture resistance test. Thus, this adhesive is suitable for bonding of these materials. A typical adhesive using a thiol-based curing agent exhibits a significant decrease in the bonding strength after the moisture resistance test, leading to a problem that the adhesive is deteriorated after the long-term moisture resistance test.

The adhesive contains (A) the thermosetting resin,
(B) the thiol compound represented by the general formula (1):

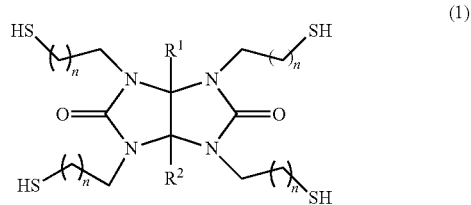

(in the formula, R1 and R2 independently denote hydrogen, the alkyl group with a carbon number of 1 to 10, or the phenyl group and n is an integer of 0 to 10), and
(C) the latent curing agent.

The thermosetting resin as the component (A) is preferably at least one selected from the group consisting of epoxy resin and acrylic resin. More preferably, the component (A)

contains epoxy resin. In the case of containing the epoxy resin, adhesive force for each bonding target body can be ensured. The epoxy resin includes, for example, liquid bisphenol A type epoxy resin, liquid bisphenol F type epoxy resin, liquid naphthalene type epoxy resin, liquid hydrogenated bisphenol type epoxy resin, liquid alicyclic epoxy resin, liquid alcohol ether type epoxy resin, liquid cycloaliphatic epoxy resin, liquid fluorene type epoxy resin, and liquid siloxane-based epoxy resin. Considering curability, thermal resistance, adhesiveness, and durability, liquid bisphenol A type epoxy resin, liquid bisphenol F type epoxy resin, liquid siloxane-based epoxy resin, and aminophenol type epoxy resin are preferable. Moreover, an epoxy equivalent is preferably 80 to 250 g/eq, considering viscosity adjustment. Commercialized products include, for example, bisphenol A type epoxy resin (Product Name: YDF8170) manufactured by Nippon Steel and Sumikin Chemical Co., Ltd., bisphenol F type epoxy resin (Product Name: YDF870GS) manufactured by Nippon Steel and Sumikin Chemical Co., Ltd., naphthalene type epoxy resin (Product Name: HP4032D) manufactured by DIC, siloxane-based epoxy resin (Product Name: TSL9906) manufactured by Shin-Etsu Chemical Co., Ltd., and aminophenol type epoxy resin (Grade: JER630, JER630LSD) manufactured by Mitsubishi Chemical Corporation. The component (A) can be used alone. Alternatively, two or more types of the components (A) may be used in combination.

The acrylic resin as the (A) component can provide transparency and appropriate hardness to the cured resin composition. This (A) component is an acrylic acid ester monomer and/or a methacrylic acid ester monomer, or an oligomer thereof. Examples of the acrylic acid ester monomer and/or the methacrylic acid ester monomer, or the oligomer thereof which are usable in the present invention may include diacrylate and/or dimethacrylate of tris(2-hydroxyethyl)isocyanurate, tris(2-hydroxyethyl)isocyanurate triacrylate and/or trimethacrylate, trimethylolpropane triacrylate and/or trimethacrylate, or an oligomer thereof, pentaerythritol triacrylate and/or trimethacrylate, or an oligomer thereof, polyacrylate and/or polymethacrylate of dipentaerythritol, tris(acryloxyethyl)isocyanurate, caprolactone-modified tris(acryloxyethyl)isocyanurate, caprolactone-modified tris(methacryloxyethyl)isocyanurate, polyacrylate and/or polymethacrylate of alkyl-modified dipentaerythritol, and polyacrylate and/or polymethacrylate of caprolactone-modified dipentaerythritol. Examples of a commercially available product of the (A) component may include polyester acrylate (product name: EBECRYL810) manufactured by Daicel-Allnex Ltd. and polyester acrylate (product name: M7100) manufactured by Toagosei Co., Ltd. One (A) component may be used alone. Also, two or more (A) components may be used in combination.

The component (B) is the thiol compound represented by the general formula (1):

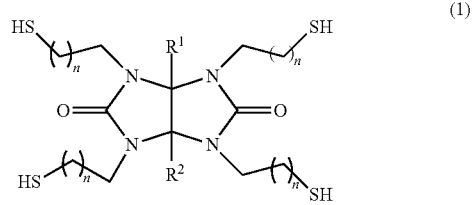

(in the formula, R1 and R2 independently denote hydrogen, the alkyl group with a carbon number of 1 to 10, or the phenyl group and n is an integer of 0 to 10). The component (B) includes, for example, a multifunctional nitrogen-containing heterocyclic compound represented by a chemical formula (2) or a chemical formula (3)

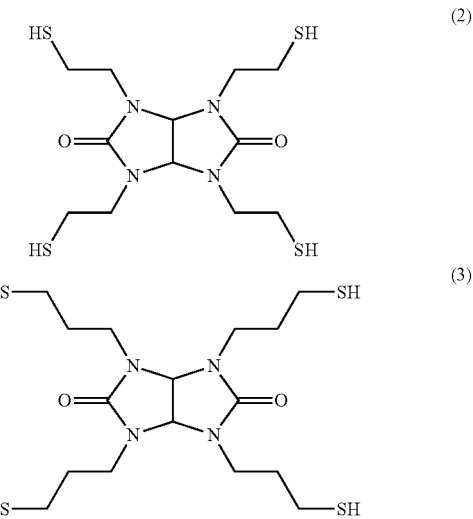

and having functional groups (—CH$_2$—CH$_2$—SH or —CH$_2$—CH$_2$—CH$_2$—SH) bonded to four nitrogen atoms of the nitrogen-containing heterocyclic compound. Any of the above-described typical thiol-based curing agents (e.g., pentaerythritol tetrakis(3-mercaptopropionate) (Product Name: PEMP)) manufactured by SC Organic Chemical Co., Ltd., trimethylolpropane tris(3-mercaptopropionate) (Product Name: TMMP) manufactured by SC Organic Chemical Co., Ltd., and pentaerythritol tetrakis(3-mercaptobutyrate) (Product Name: Karenz MT PE1) manufactured by Showa Denko K. K. contains an ester bond. This ester bond is easily hydrolyzed. Thus, it is assumed that low moisture resistance is exhibited. In contrast, the component (B) contains no ester bond. Thus, a decrease in the strength after the moisture resistance test is suppressed. A commercialized product of the component (B) includes, for example, a thiol glycoluril derivative manufactured by Shikoku Chemicals Corporation. The component (B) can be used alone. Alternatively, two or more types of the components (B) may be used in combination.

The latent curing agent as the (C) component is a compound which is in an inactive state at room temperature, and is activated by heating to act as a curing accelerator. Examples of such a latent curing agent may include an imidazole compound which is solid at normal temperature, a solid-dispersed amine adduct latent curing accelerator such as a reaction product of an amine compound and an epoxy compound (amine-epoxy adduct product), and a reaction product of an amine compound and an isocyanate compound or a urea compound (urea-type adduct product). By combination of the component (C) and the component (B), the adhesive can be cured at low temperature.

Examples of the imidazole compound which is solid at normal temperature may include 2-heptadecylimidazole, 2-phenyl-4,5-dihydroxymethylimidazole, 2-undecylimidazole, 2-phenyl-4-methyl-5-hydroxymethylimidazole, 2-phenyl-4-benzyl-5-hydroxymethylimidazole, 2,4-diamino-6-(2-methyl imidazolyl-(1))-ethyl-S-triazine, 2,4-diamino-6-(2'-methyl imidazolyl-(1)')-ethyl-S-triazine•isocyanuric acid adducts, 2-methylimidazole, 2-phenylimidazole, 2-phenyl- 4-methylimidazole, 1-cyanoethyl-2-phenylimidazole, 1-cyanoethyl-2-methylimidazole-trimellitate, 1-cyanoethyl-2-phenylimidazole-trimellitate, N-(2-methylimidazolyl-1-ethyl)-urea, and N,N'-(2-methylimidazolyl-(1)-ethyl)-adipoyl diamide. However, the imidazole compound which is solid at normal temperature is not limited to these examples.

Examples of an epoxy compound used as one of raw materials for manufacturing the solid-dispersed amine adduct latent curing accelerator (amine-epoxy adduct curing accelerator) may include polyglycidyl ether obtained by the reaction between polyhydric phenol such as bisphenol A, bisphenol F, catechol, and resorcinol, or polyhydric alcohol such as glycerin and polyethylene glycol, and epichlorohydrin, glycidyl ether ester obtained by the reaction between hydroxycarboxylic acid such as p-hydroxybenzoic acid and β-hydroxynaphthoic acid, and epichlorohydrin, polyglycidyl ester obtained by the reaction between polycarboxylic acid such as phthalic acid and terephthalic acid, and epichlorohydrin, and a glycidyl amine compound obtained by the reaction between 4,4'-diaminodiphenylmethane, m-aminophenol, or the like, and epichlorohydrin. Further examples may include a multifunctional epoxy compound such as an epoxidized phenol novolac resin, an epoxidized cresol novolac resin, and epoxidized polyolefin, and a monofunctional epoxy compound such as butyl glycidyl ether, phenyl glycidyl ether, and glycidyl methacrylate. However, the above-described epoxy compound is not limited to these.

An amine compound used as another raw material for manufacturing the solid-dispersed amine adduct latent curing accelerator may be any compound which has in its molecule one or more active hydrogens which can undergo an addition reaction with an epoxy group, and has in its molecule one or more functional groups selected from a primary amino group, a secondary amino group, and a tertiary amino group. Examples of such an amine compound will be indicated below. However, the above-described amino compound is not limited to these. Examples thereof may include aliphatic amines such as diethylenetriamine, triethylenetetramine, n-propylamine, 2-hydroxyethyl aminopropylamine, cyclohexylamine, and 4,4'-diamino-dicyclohexylmethane, an aromatic amine compound such as 4,4'-diaminodiphenylmethane and 2-methylaniline, and a nitrogen atom-containing heterocyclic compound such as 2-ethyl-4-methylimidazole, 2-ethyl-4-methylimidazoline, 2,4-dimethylimidazoline, piperidine, and piperazine. However, the above-described amino compound is not limited to these.

Among these, the compound having in its molecule a tertiary amino group is particularly a raw material which provides a latent curing accelerator having excellent curing-promoting properties. Examples of such a compound may include primary or secondary amines having in its molecule a tertiary amino group, such as an amine compound such as dimethylaminopropylamine, diethylaminopropylamine, di-n-propylaminopropylamine, dibutylaminopropylamine, dimethylaminoethylamine, diethylaminoethylamine, and N-methylpiperazine, and an imidazole compound such as 2-methylimidazole, 2-ethylimidazole, 2-ethyl-4-methylimidazole, and 2-phenylimidazole. Further examples may include alcohols, phenols, thiols, carboxylic acids, hydrazides, and the like, which have in its molecule a tertiary amino group, such as 2-dimethylaminoethanol, 1-methyl-2-dimethylaminoethanol, 1-phenoxymethyl-2-dimethylaminoethanol, 2-diethylaminoethanol, 1-butoxymethyl-2-dimethylaminoethanol, 1-(2-hydroxy-3-phenoxypropyl)-2-methylimidazole, 1-(2-hydroxy-3-phenoxypropyl)-2-ethyl-4-methylimidazole, 1-(2-hydroxy-3-butoxypropyl)-2-methylimidazole, 1-(2-hydroxy-3-butoxypropyl)-2-ethyl-4-methylimidazole, 1-(2-hydroxy-3-phenoxypropyl)-2-phenylimidazoline, 1-(2-hydroxy-3-butoxypropyl)-2-methylimidazoline, 2-(dimethylaminomethyl)phenol, 2,4,6-tris(dimethylaminomethyl)phenol, N-β-hydroxyethylmorpholine, 2-dimethylaminoethanethiol, 2-mercaptopyridine, 2-benzoimidazole, 2-mercaptobenzoimidazole, 2-mercaptobenzothiazole, 4-mercaptopyridine, N,N-dimethylaminobenzoic acid, N,N-dimethylglycine, nicotinic acid, isonicotinic acid, picolinic acid, N,N-dimethylglycine hydrazide, N,N-dimethylpropionic acid hydrazide, nicotinic acid hydrazide, and isonicotinic acid hydrazide. However, the above-described compound having in its molecule a tertiary amino group is not limited to these.

Examples of an isocyanate compound used as further another raw material of the solid-dispersed amine adduct latent curing accelerator may include a monofunctional isocyanate compound such as n-butyl isocyanate, isopropyl isocyanate, phenyl isocyanate, and benzyl isocyanate, and a multifunctional isocyanate compound such as hexamethylene diisocyanate, toluylene diisocyanate, 1,5-naphthalene diisocyanate, diphenylmethane-4,4'-diisocyanate, isophorone diisocyanate, xylyl ene diisocyanate, paraphenylene diisocyanate, 1,3,6-hexamethylene triisocyanate, and bicycloheptane triisocyanate. Furthermore, there can be used a compound containing at its terminal an isocyanate group, which is obtained by the reaction between these multifunctional isocyanate compounds and an active hydrogen compound. Examples of such a compound containing at its terminal an isocyanate group may include an adduct compound having at its terminal an isocyanate group, which is obtained by the reaction between toluylene diisocyanate and trimethylolpropane, and an adduct compound having at its terminal an isocyanate group, which is obtained by the reaction between toluylene diisocyanate and pentaerythritol. However, the above-described compound containing at its terminal an isocyanate group is not limited to these.

Also, examples of the urea compound may include urea and thiourea. However, the above-described urea compound is not limited to these.

The solid-dispersed latent curing accelerator usable in the present invention can be easily manufactured by, for example, as follows. There are mixed (a) two components of the amine compound and the epoxy compound, (b) three components of these two components and the active hydrogen compound, or (c) two components or three components of the amine compound, and the isocyanate compound and/or the urea compound. Then, these mixed components are subjected to a reaction at a temperature from room temperature to 200° C. Thereafter, the obtained reaction product is cooled and solidified, and thereafter ground. Alternatively, the above-described components are subjected to a reaction in a solvent such as methyl ethyl ketone, dioxane, and tetrahydrofuran. Then, the solvent is removed from the reaction product. Thereafter, the solid content is ground.

Of representative examples of commercialized products of the above-described solid dispersion type latent curing accelerator, examples of the amine-epoxy-adduct-based (amine-adduct-based) accelerator include "Ajicure PN-23" (a product name manufactured by Ajinomoto Fine-Techno Co., Inc.), "Ajicure PN-40" (a product name manufactured by Ajinomoto Fine-Techno Co., Inc.), "Ajicure PN-50" (a product name manufactured by Ajinomoto Fine-Techno Co., Inc.), "Hardener X-3661S" (a product name manufactured by A.C.R. Co., Ltd), "Hardener X-3670S (a product name manufactured by A.C.R. Co., Ltd), "Novacure HX-3742" (a product name manufactured by Asahi Kasei E-Materials Corporation), "Novacure HX-3721 (a product name manufactured by Asahi Kasei E-Materials Corporation), "Novacure HXA-3922HP" (a product name manufactured by Asahi Kasei E-Materials Corporation), and "FXR1121" (a product name manufactured by T&K Toka Corporation).

Moreover, examples of the urea-adduct-based accelerator include "Fujicure FXE-1000" (a product name manufactured by T&K Toka Corporation) and "Fujicure FXR-1030" (a product name manufactured by T&K Toka Corporation). Note that the above-described commercialized products are not limited to these products. The component (C) can be used alone. Alternatively, two or more types of the components (C) may be used in combination.

Considering the viscosity of the adhesive, the content of the component (A) is preferably 10 to 90 parts by mass with respect to 100 parts by mass of the adhesive.

The thiol equivalent of the component (B) is preferably 0.5 to 2.5 equivalent with respect to an epoxy equivalent of 1 in the component (A). The thiol equivalent of the component (B) is a value obtained by dividing the molecular weight of the component (B) by the number of thiol groups per molecular. When the thiol equivalent of the component (B) and the epoxy equivalent of the component (A) can fall within the above-described ranges, lack of hardness and toughness of the adhesive after curing can be prevented.

The value of [thiol equivalent of (B) component]/[acryl equivalent of (A) component] of the resin composition is preferably 0.5 to 2.0. The thiol equivalent of the (B) component is a numerical value (chemical formula (1): 95.7, chemical formula (2): 109.7) obtained by dividing the molecular weight (chemical formula (1): 382.6, chemical formula (2): 438.7) of the (B) component by the number (4) of thiol groups in one molecule. The equivalent of an acrylic resin equals to a value obtained by dividing the molecular weight of the acrylic resin by the number of acryl groups (or methacryl groups) in one molecule. Therefore, when the value of [thiol equivalent of (B) component]/[acryl equivalent of (A) component] is 0.5 to 2.0, it is indicated that [(95.7 for chemical formula (1) or 109.7 for chemical formula (2))/acryl equivalent of (A) component] is 0.5 to 2.0, or that the acryl equivalent of the (A) component is 188 to 250. When the value of [thiol equivalent of (B) component]/[acryl equivalent of (A) component] falls within the range of 0.5 to 2.0, acryl and thiol react with each other in amounts equal to or more than a certain amount thereby to form a firm cured product. Thus, high adhesive strength can be expressed.

Considering the curing speed of the resin component and pot life, the content of the component (C) is preferably 0.1 to 40 parts by mass with respect to 100 parts by mass of the adhesive.

Preferably, (D) photo radical generating agent is further added to the adhesive. With addition of (D) the photo radical generating agent, ultraviolet (UV) curability can be provided to the adhesive. Commercialized products of the component (D) include, for example, a photo radical generating agent (Product Name: IRGACURE TPO) manufactured by BASF SE.

As necessary, the adhesive can be, without impairing the objective of the present invention, mixed with a filler such as a silica filler, a stabilizing agent, carbon black, titanium black, a silane coupling agent, an ion trapping agent, a leveling agent, an antioxidant, an antifoaming agent, a thixotropic agent, and other additives, for example. Moreover, the adhesive may be mixed with a viscosity adjustment agent, a flame retardant, or a solvent, for example.

The adhesive can be obtained by, for example, simultaneously or separately stirring, melting, mixing and dispersing the (A) to (C) components, additives, and the like, while performing a heat treatment as necessary. The apparatuses for these mixing, stirring, dispersing, and the like are not particularly limited. There can be used an automated mortar, a Henschel mixer, a three-roll mill, a ball mill, a planetary mixer, a bead mill, and the like which are equipped with a stirrer and a heater. Also, an appropriate combination of these apparatuses may be used.

The adhesive obtained as described above is thermosetting. In the case of using the adhesive for the image sensor module, thermal curing of the adhesive is preferably performed at 60 to 90° C. for 30 to 120 minutes. Note that in the case of the adhesive using other curing agents than the typical thiol-based curing agent, thermal curing is performed at 100 to 120° C. for 60 to 120 minutes. In addition, the bonding strength of the cured product obtained by curing the typical thiol-based adhesive at low temperature decreases from 300 N/Chip before the test to about ⅓, i.e., 100 N/Chip, within 100 hours under conditions including a temperature of 85° C. and a relative humidity of 85%. However, in the case of using the component (B) represented by the general formula (1), the bonding strength is maintained at 250 N/Chip from 300 N/Chip before the test after 100 hours under the conditions including a temperature of 85° C. and a relative humidity of 85%. As described above, a decrease rate is lower than to that of the typical thiol-based adhesive. The lenses built in the image sensor module do not exhibit excellent thermal resistance. For this reason, the adhesive used for the semiconductor device of the present invention can reduce deterioration of the lenses, and therefore, is extremely useful.

EXAMPLES

Hereinafter, the present invention will be described by examples. However, the present invention is not limited to these examples. It is noted that in the following examples, "parts" and "%" indicate parts by mass and % by mass respectively, unless otherwise stated.

Raw materials were mixed at each mixing ratio shown in Tables 1 and 2. Subsequently, the mixture was dispersed using a triple roll mill at room temperature, and as a result, an adhesive A, an adhesive B, an adhesive C, an adhesive D, and an adhesive E were prepared.

<Bonding Strength>

By using combinations shown in Tables 3 to 12, the adhesive A or the adhesive B was printed to a diameter of 2 mm on a substrate (a lower adherend) made of a selected material by means of a stencil (n=10). A adherend (an upper adherend) having 1×2 mm square and a thickness of 0.5 mm and made of a selected material was further mounted. Next, the resultant was held at 80° C. for 60 minutes for performing thermal curing. In this manner, each test piece was obtained.

In Tables 3 to 7, EP is LCP, ceramics are alumina, and metal is stainless steel. Moreover, in Tables 8 to 12, PE is polyethylene as commodity plastic. PP is polypropylene as commodity plastic. A side surface of each produced test piece was poked by a MODEL-1605HTP type strength testing machine manufactured by Aikoh Engineering Co., Ltd. Then, shear strength was calculated from a numerical value when one of the adherends was peeled off. When the shear strength was equal to or greater than 50 N/chip, the shear strength was evaluated as "good." When the shear strength was less than 50 N/chip, the shear strength was evaluated as "poor." Measurement results are shown in the section of the bonding strength of Tables 3 to 12. Next, a moisture resistance test was performed. Each test piece produced as in the case of the bonding strength was held at a temperature of 85° C. and a humidity of 85% for 500 hours. Subsequently, the shear strength calculated as described above was evaluated as "good" or "poor." Results are shown in the section of the moisture resistance strength of Tables 3 to 12.

TABLE 1

|  |  | Adhesive A | Adhesive B |
|---|---|---|---|
| Component (A) | Bisphenol A Type/F Type Epoxy Resin Mixture [1] | 28.08 | 23.43 |
| Component (B) | Thiol Compound Represented by Chemical Formula (1) [2] | 50.74 | 0 |
| Component (B') | Pentaerythritol Tetrakis(3-mercaptopropionate) [3] | 0 | 49.76 |
| Component (C) | Latent Curing Agent [4] | 14.36 | 26.81 |
| The other | Reactive Diluent [5] | 6.82 | 0 |
|  | Total | 100.00 | 100.00 |

[1] Bisphenol F Type Epoxy Resin (Product Name: EXA835LV) Manufactured by DIC, Epoxy Equivalent: 165 g/eq
[2] Glycoluril Derivative (Product Name: TS-G) Manufactured by Shikoku Chemicals Corporation, Thiol Equivalent: 94 g/eq
[3] Pentaerythritol Tetrakis(3-mercaptopropionate) (Product Name: PEMP) Manufactured by SC Organic Chemical Co., Ltd.
[4] Latent Curing Agent (Product Name: HXA3922HP, 2/3 (in a mass ratio) is a latent curing agent of a bisphenol A type/F type epoxy resin mixture, Epoxy Equivalent: 180 × 3/2 g/eq) Manufactured by Asahi Kasei E-Materials Corporation
[5] Reactive Diluent (Product Name: CDMDG, Epoxy Equivalent: 135 g/eq) Manufactured by Showa Denko K.K.

TABLE 2

|  |  | Adhesive C | Adhesive D | Adhesive E |
|---|---|---|---|---|
| Component (A) | Bisphenol A Type/F Type Epoxy Resin Mixture [1] | 0 | 0 | 0 |
|  | Acrylic Acid Ester Monomer [6] | 59.11 | 64.87 | 51.69 |
| Component (B) | Thiol Compound Represented by Chemical Formula (1) [2] | 34.81 | 32.43 | 0 |
| Component (B') | Pentaerythritol Tetrakis(3-mercaptopropionate) [3] | 0 | 0 | 37.82 |
| Component (C) | Latent Curing Agent [4] | 5.07 | 0 | 9.48 |
|  | Latent Curing Agent 2 [7] | 0 | 1.69 | 0 |
| Component (D) | Photo Radical Generating Agent [8] | 1.01 | 1.01 | 1.01 |
| The other | Reactive Diluent [5] | 0 | 0 | 0 |
|  | Total | 100.00 | 100.00 | 100.00 |

[6] Polyester Acrylate (Product Name: M7100, Acrylic Equivalent: 188 g/eq) Manufactured by Toagosei Co., Ltd.
[7] Latent Curing Agent (Product Name: FXR1121) Manufactured by T&K Toka Corporation
[8] Photo Radical Generating Agent (Product Name: IRGCURE TPO) Manufactured by BASF SE.

TABLE 3

|  | 1st Example | 2nd Example | 3rd Example | 4th Example | 5th Example | 6th Example |
|---|---|---|---|---|---|---|
| Adhesive | Adhesive A | | | | | |
| Adherend 1 | EP | EP | EP | Ceramics | Ceramics | Metal |
| Adherend 2 | EP | Ceramics | Metal | Ceramics | Metal | Metal |
| Bonding Strength | Good | Good | Good | Good | Good | Good |
| Moisture Resistance Strength | Good | Good | Good | Good | Good | Good |

TABLE 4

|  | 1st Comparative Example | 2nd Comparative Example | 3rd Comparative Example | 4th Comparative Example | 5th Comparative Example | 6th Comparative Example |
|---|---|---|---|---|---|---|
| Adhesive | Adhesive B | | | | | |
| Adherend 1 | EP | EP | EP | Ceramics | Ceramics | Metal |
| Adherend 2 | EP | Ceramics | Metal | Ceramics | Metal | Metal |
| Bonding Strength | Good | Good | Good | Good | Good | Good |
| Moisture Resistance Strength | Poor | Poor | Poor | Poor | Poor | Poor |

TABLE 5

|  | 7th Example | 8th Example | 9th Example | 10th Example | 11th Example | 12th Example |
|---|---|---|---|---|---|---|
| Adhesive | Adhesive C | | | | | |
| Adherend 1 | EP | EP | EP | Ceramics | Ceramics | Metal |
| Adherend 2 | EP | Ceramics | Metal | Ceramics | Metal | Metal |
| Bonding Strength | Good | Good | Good | Good | Good | Good |
| Moisture Resistance Strength | Good | Good | Good | Good | Good | Good |

TABLE 6

|  | 13th Example | 14th Example | 15th Example | 16th Example | 17th Example | 18th Example |
|---|---|---|---|---|---|---|
| Adhesive | Adhesive D | | | | | |
| Adherend 1 | EP | EP | EP | Ceramics | Ceramics | Metal |
| Adherend 2 | EP | Ceramics | Metal | Ceramics | Metal | Metal |
| Bonding Strength | Good | Good | Good | Good | Good | Good |
| Moisture Resistance Strength | Good | Good | Good | Good | Good | Good |

TABLE 7

|  | 7th Comparative Example | 8th Comparative Example | 9th Comparative Example | 10th Comparative Example | 11th Comparative Example | 12th Comparative Example |
|---|---|---|---|---|---|---|
| Adhesive | Adhesive E | | | | | |
| Adherend 1 | EP | EP | EP | Ceramics | Ceramics | Metal |
| Adherend 2 | EP | Ceramics | Metal | Ceramics | Metal | Metal |
| Bonding Strength | Good | Good | Good | Good | Good | Good |
| Moisture Resistance Strength | Poor | Poor | Poor | Poor | Poor | Poor |

TABLE 8

| | 19th Comparative Example | 20th Comparative Example | 21st Comparative Example | 22nd Comparative Example | 22nd Comparative Example | 13th Comparative Example | 14th Comparative Example |
|---|---|---|---|---|---|---|---|
| Adhesive | | | Adhesive A | | | Adhesive A | |
| EP | LCP | PC | PI | PA | FR-4 | PE | PP |
| Ceramics | Alumina | Alumina | Alumina | Alumina | Alumina | Alumina | Alumina |
| Bonding Strength | Good | Good | Good | Good | Good | Poor | Poor |
| Moisture Resistance Strength | Good | Good | Good | Good | Good | Poor | Poor |

TABLE 9

| | 15th Comparative Example | 16th Comparative Example | 17th Comparative Example | 18th Comparative Example | 19th Comparative Example | 20th Comparative Example | 21st Comparative Example |
|---|---|---|---|---|---|---|---|
| Adhesive | | | | Adhesive B | | | |
| EP | LCP | PC | PI | PA | FR-4 | PE | PP |
| Ceramics | Alumina | Alumina | Alumina | Alumina | Alumina | Alumina | Alumina |
| Bonding Strength | Good | Good | Good | Good | Good | Poor | Poor |
| Moisture Resistance Strength | Poor | Poor | Poor | Poor | Poor | Poor | Poor |

TABLE 10

| | 23rd Example | 24th Example | 25th Example | 26th Example | 27th Example | 22nd Comparative Example | 23rd Comparative Example |
|---|---|---|---|---|---|---|---|
| Adhesive | | | Adhesive C | | | Adhesive C | |
| EP | LCP | PC | PI | PA | FR-4 | PE | PP |
| Ceramics | Alumina | Alumina | Alumina | Alumina | Alumina | Alumina | Alumina |
| Bonding Strength | Good | Good | Good | Good | Good | Poor | Poor |
| Moisture Resistance Strength | Good | Good | Good | Good | Good | Poor | Poor |

TABLE 11

| | 28th Example | 29th Example | 30th Example | 31st Example | 32nd Example | 24th Comparative Example | 25th Comparative Example |
|---|---|---|---|---|---|---|---|
| Adhesive | | | Adhesive D | | | Adhesive D | |
| EP | LCP | PC | PI | PA | FR-4 | PE | PP |
| Ceramics | Alumina | Alumina | Alumina | Alumina | Alumina | Alumina | Alumina |
| Bonding Strength | Good | Good | Good | Good | Good | Poor | Poor |
| Moisture Resistance Strength | Good | Good | Good | Good | Good | Poor | Poor |

TABLE 12

| | 26th Comparative Example | 27th Comparative Example | 28th Comparative Example | 29th Comparative Example | 30th Comparative Example | 31st Comparative Example | 32nd Comparative Example |
|---|---|---|---|---|---|---|---|
| Adhesive | | | | Adhesive E | | | |
| EP | LCP | PC | PI | PA | FR-4 | PE | PP |
| Ceramics | Alumina | Alumina | Alumina | Alumina | Alumina | Alumina | Alumina |
| Bonding Strength | Good | Good | Good | Good | Good | Poor | Poor |
| Moisture Resistance Strength | Poor | Poor | Poor | Poor | Poor | Poor | Poor |

As will be seen from Tables 3 to 12, all of the 1st to 321th examples using the adhesive A containing the components (A) to (C) exhibit high bonding strength and moisture resistance strength. On the other hand, the 1st to 6th and 15th to 21th comparative examples using the adhesive B using pentaerythritol tetrakis(3-mercaptopropionate) instead of the component (B) and the 7th to 12th and 26th to 32th comparative examples using the adhesive E exhibit low moisture resistance strength. The 20th, 21th, 31th, and 32th comparative examples using the adhesive B or the adhesive E and using PE or PP as the adherend exhibit low bonding strength and moisture resistance strength. Moreover, even when the adhesive A, the adhesive C, or the adhesive D is used, the 13th, 14th, and 22th to 25th comparative examples using PE or PP as the adherends exhibit low bonding strength, as well as exhibiting low moisture resistance strength.

INDUSTRIAL APPLICABILITY

According to the present invention, a semiconductor containing adherends bonded with a cured product of an adhesive is provided. A moisture resistance test after curing shows that a decrease in the bonding strength of the cured product of the adhesive is suppressed. Thus, this semiconductor exhibits high reliability.

LIST OF REFERENCE NUMERALS 1 image sensor module
10 cured product of adhesive
20 substrate
30 image sensor
40 optical lens
50 optical filter
60 lens barrel
70 voice coil motor (VCM)

The invention claimed is:
1. A semiconductor device comprising:
at least two adherends each made of at least one material selected from the group consisting of engineering plastic, ceramics, and metal and bonded with a cured product of an adhesive,
wherein the adhesive contains
(A) thermosetting resin,
(B) a thiol compound represented by a general formula (1):

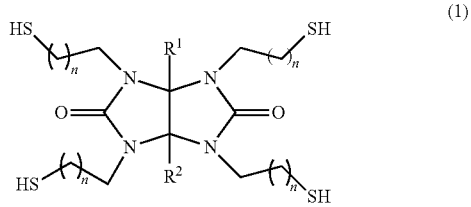

where R1 and R2 independently denote hydrogen, an alkyl group with a carbon number of 1 to 10, or a phenyl group and n is an integer of 0 to 10, and
(C) a latent curing agent, and
wherein the component (A) is one or more selected from a group consisting of an acrylic acid ester monomer, a methacrylic acid ester monomer, an oligomer of the acrylic acid ester monomer, an oligomer of the methacrylic acid ester monomer and an oligomer of the acrylic acid ester monomer and the methacrylic acid ester monomer, and
wherein at least one of the adherends is made of the engineering plastic.

2. The semiconductor device according to claim 1, wherein
the adhesive further contains epoxy resin.
3. The semiconductor device according to claim 1, wherein
the engineering plastic is super engineering plastic.
4. The semiconductor device according to claim 1, wherein
the engineering plastic is at least one selected from the group consisting of liquid crystal polymer, polycarbonate, polyimide, polyamide, and epoxy resin.
5. The semiconductor device according to claim 1, wherein
at least one of the adherends is made of the ceramics, and an imaging device is on the ceramics.
6. The semiconductor device according to claim 1, wherein
an optical component is on the engineering plastic.
7. The semiconductor device according to claim 1, wherein
an electronic component is on the engineering plastic.
8. An image sensor module comprising:
the semiconductor device according to claim 1.
9. The semiconductor device according to claim 2, wherein
the engineering plastic is super engineering plastic.
10. The semiconductor device according to claim 2, wherein
the engineering plastic is at least one selected from the group consisting of liquid crystal polymer, polycarbonate, polyimide, polyamide, and epoxy resin.
11. The semiconductor device according to claim 2, wherein
at least one of the adherends is made of the ceramics, and an imaging device is on the ceramics.
12. The semiconductor device according to claim 2, wherein
an optical component is on the engineering plastic.
13. The semiconductor device according to claim 2, wherein
an electronic component is on the engineering plastic.
14. An image sensor module comprising:
the semiconductor device according to claim 2.
15. An image sensor module comprising a semiconductor device,
wherein the semiconductor device comprises:
at least two adherends each made of at least one material selected from the group consisting of engineering plastic, ceramics, and metal and bonded with a cured product of an adhesive,
wherein the adhesive contains
(A) thermosetting resin,
(B) a thiol compound represented by a general formula (1):

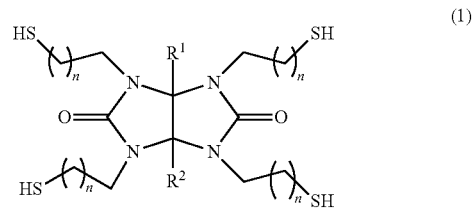

where R1 and R2 independently denote hydrogen, an alkyl group with a carbon number of 1 to 10, or a phenyl group and n is an integer of 0 to 10, and
(C) a latent curing agent, and
wherein the component (A) is one or more selected from a group consisting of an acrylic acid ester monomer, a methacrylic acid ester monomer, an oligomer of the acrylic acid ester monomer, an oligomer of the methacrylic acid ester monomer and an oligomer of the acrylic acid ester monomer and the methacrylic acid ester monomer.

* * * * *